United States Patent
Kamakura

(10) Patent No.: US 9,370,106 B2
(45) Date of Patent: Jun. 14, 2016

(54) METHOD FOR PRODUCING PACKAGE, METHOD FOR PRODUCING ELECTRONIC DEVICE, AND ELECTRONIC DEVICE

(71) Applicant: Seiko Epson Corporation, Tokyo (JP)

(72) Inventor: Tomoyuki Kamakura, Matsumoto (JP)

(73) Assignee: Seiko Epson Corporation (JP)

( * ) Notice: Subject to any disclaimer, the term of this patent is extended or adjusted under 35 U.S.C. 154(b) by 134 days.

(21) Appl. No.: 13/962,201

(22) Filed: Aug. 8, 2013

(65) Prior Publication Data

US 2014/0049927 A1  Feb. 20, 2014

(30) Foreign Application Priority Data

Aug. 18, 2012 (JP) ................. 2012-181247

(51) Int. Cl.
*H05K 5/06* (2006.01)
*H05K 1/18* (2006.01)
*C04B 37/04* (2006.01)
*H03H 9/10* (2006.01)
*C04B 37/00* (2006.01)
*H05K 1/02* (2006.01)

(52) U.S. Cl.
CPC .............. *H05K 1/183* (2013.01); *C04B 37/005* (2013.01); *C04B 37/045* (2013.01); *H03H 9/1021* (2013.01); *C04B 2237/10* (2013.01); *H01L 2224/16225* (2013.01); *H05K 1/0284* (2013.01); *H05K 2201/10075* (2013.01)

(58) Field of Classification Search
CPC ........... H02G 3/08; H02G 3/081; H02G 3/14; H05K 5/00; H05K 5/02; H05K 5/0091; H05K 5/0095; H05K 5/0217; H05K 5/04; H05K 1/183; H05K 1/0284; H05K 2201/10075; H01L 23/02; H01L 23/08; H01L 2224/16225; H03H 9/02; H03H 3/02; H03H 9/1021; C04B 37/045; C04B 37/005; C04B 2237/10
USPC ........ 174/50, 50.5, 50.51, 50.52, 50.61, 520, 174/528, 538, 539, 535, 559, 560, 255; 257/704, 710, 794, 678; 438/107, 126, 438/127, 455, 106; 361/760, 311, 320, 361/321.1
See application file for complete search history.

(56) References Cited

U.S. PATENT DOCUMENTS 4,761,518 A * 8/1988 Butt et al. ................. 174/538
5,585,687 A  12/1996 Wakabayashi
6,977,339 B2 * 12/2005 Fukushima ............... 174/528

(Continued)

FOREIGN PATENT DOCUMENTS

CN  102227872 A  10/2011
CN  102471137 A  5/2012

(Continued)

*Primary Examiner* — Angel R Estrada
(74) *Attorney, Agent, or Firm* — Harness, Dickey & Pierce, P.L.C.

(57) ABSTRACT

A method for producing a package includes preparing a base substrate provided with a low-melting glass and a lid, defoaming the low-melting glass by heating the low-melting glass to a temperature equal to or higher than the pour point in a reduced pressure atmosphere, and joining the base substrate and the lid to each other by superimposing the base substrate and the lid on each other through the low-melting glass, and then heating the low-melting glass to a temperature equal to or higher than the pour point in a reduced pressure atmosphere.

9 Claims, 11 Drawing Sheets

(56) References Cited

U.S. PATENT DOCUMENTS

| | | | |
|---|---|---|---|
| 8,320,102 B2 * | 11/2012 | Kurioka et al. | 361/311 |
| 8,431,820 B2 * | 4/2013 | Yamamoto et al. | 174/50.5 |
| 8,804,316 B2 * | 8/2014 | Shiraki et al. | 174/520 |
| 8,836,095 B2 * | 9/2014 | Maeda et al. | 174/50.51 |
| 2011/0215879 A1 | 9/2011 | Aratake | |
| 2012/0139133 A1 | 6/2012 | Takahashi | |

FOREIGN PATENT DOCUMENTS

| | | |
|---|---|---|
| JP | 01-212256 | 8/1989 |
| JP | 08-018380 | 1/1996 |
| JP | 2000-332140 | 11/2000 |
| JP | 2004-172752 | 6/2004 |

* cited by examiner

METHOD FOR PRODUCING PACKAGE, METHOD FOR PRODUCING ELECTRONIC DEVICE, AND ELECTRONIC DEVICE

BACKGROUND

1. Technical Field

The present invention relates to a method for producing a package, a method for producing an electronic device, and an electronic device.

2. Related Art

There has been known an electronic device formed by housing an electronic component such as an oscillating device in a package. Further, such an electronic device is generally produced by preparing abase substrate, mounting an oscillating device on the base substrate, joining a lid to the base substrate so as to hermetically seal the oscillating device (for example, JP-A-2004-172752 (PTL 1)).

In PTL 1, first, a low-melting glass paste is applied to a base substrate, and this low-melting glass is defoamed in a vacuum furnace, followed by firing. Subsequently, an oscillating device is mounted on the base substrate, and finally a lid is joined to the base substrate through the low-melting glass so as to hermetically seal the oscillating device. In such a method, since the low-melting glass has been defoamed in advance, the heating temperature when the lid is joined to the base substrate can be set relatively low, and therefore, generation of gas during the process can be suppressed.

However, in PTL 1, the conditions for defoaming are unclear, and therefore, the low-melting glass cannot be efficiently defoamed, and a problem arises that a residual air bubble acts as a leakage path to cause deterioration in airtightness, or alteration (crystallization) of the low-melting glass is accelerated to decrease the joining strength between the base substrate and the lid.

SUMMARY

An advantage of some aspects of the invention is to provide a method for producing a package having excellent joining strength and high airtightness by reliably performing defoaming, a method for producing an electronic device, and an electronic device.

The invention can be implemented as the following forms or application examples.

Application Example 1

This application example is directed to a method for producing a package including: preparing a base substrate and a lid, at least one of which is provided with a low-melting glass; defoaming the low-melting glass by heating the low-melting glass to a temperature equal to or higher than the pour point in a reduced pressure atmosphere; and joining the base substrate and the lid to each other by superimposing the base substrate and the lid on each other through the low-melting glass, and then heating the low-melting glass to a temperature equal to or higher than the pour point in a reduced pressure atmosphere.

According to this configuration, defoaming can be reliably performed, and a package having excellent joining strength and high airtightness can be produced.

Application Example 2

This application example is directed to a method for producing an electronic device including: preparing a base substrate and a lid, at least one of which is provided with a low-melting glass; defoaming the low-melting glass by heating the low-melting glass to a temperature equal to or higher than the pour point in a reduced pressure atmosphere; joining the base substrate and the lid to each other by superimposing the base substrate and the lid on each other through the low-melting glass, and then heating the low-melting glass to a temperature equal to or higher than the pour point in a reduced pressure atmosphere; and mounting a functional device on the base substrate through a supporting member, which is performed before the joining.

According to this configuration, defoaming can be reliably performed, and an electronic device having excellent joining strength and high airtightness can be produced.

Application Example 3

In the method for producing an electronic device according to the application example, it is preferred that in the defoaming, the low-melting glass is heated to a temperature equal to or higher than the working point.

According to this configuration, the defoaming of the low-melting glass can be more effectively performed.

Application Example 4

In the method for producing an electronic device according to the application example, it is preferred that in the joining, the low-melting glass is heated to a temperature equal to or higher than the pour point and equal to or lower than the working point.

According to this configuration, the temperature when performing the joining can be decreased to the minimum, and therefore, the generation of gas in the electronic device can be effectively suppressed. Further, the degree of vacuum in the electronic device can be increased.

Application Example 5

In the method for producing an electronic device according to the application example, it is preferred that the method includes heating the low-melting glass to a temperature lower than the transition point in an oxygen-containing atmosphere, which is performed before the defoaming.

According to this configuration, a binder contained in the low-melting glass can be removed (burned down), and therefore, the binder can be prevented from vaporizing into gas during the later step.

Application Example 6

In the method for producing an electronic device according to the application example, it is preferred that the low-melting glass is provided for at least the base substrate, and the mounting the functional device is performed before the defoaming.

According to this configuration, in the defoaming, the low-melting glass is defoamed, and at the same time, the supporting member can be fired. Therefore, the production process can be reduced, and further, heat damage to the low-melting glass can be reduced.

Application Example 7

In the method for producing an electronic device according to the application example, it is preferred that in the defoaming, the low-melting glass is defoamed, and at the same time, the supporting member is fired.

According to this configuration, the production process can be reduced, and further, heat damage to the low-melting glass can be reduced.

Application Example 8

This application example is directed to an electronic device including a functional device disposed in an internal space formed by joining a base substrate and a lid with a low-melting glass, wherein the cross section of the low-melting glass is in a dense state.

According to this configuration, an electronic device having excellent joining strength and high airtightness is obtained.

Application Example 9

This application example is directed to an electronic apparatus including: the electronic device according to Application Example 8.

According to this configuration, an electronic apparatus having high reliability is obtained.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, a method for producing a package, a method for producing an electronic device, and an electronic device according to the invention will be described in detail based on preferred embodiments shown in the accompanying drawings.

First Embodiment

Figure 1:
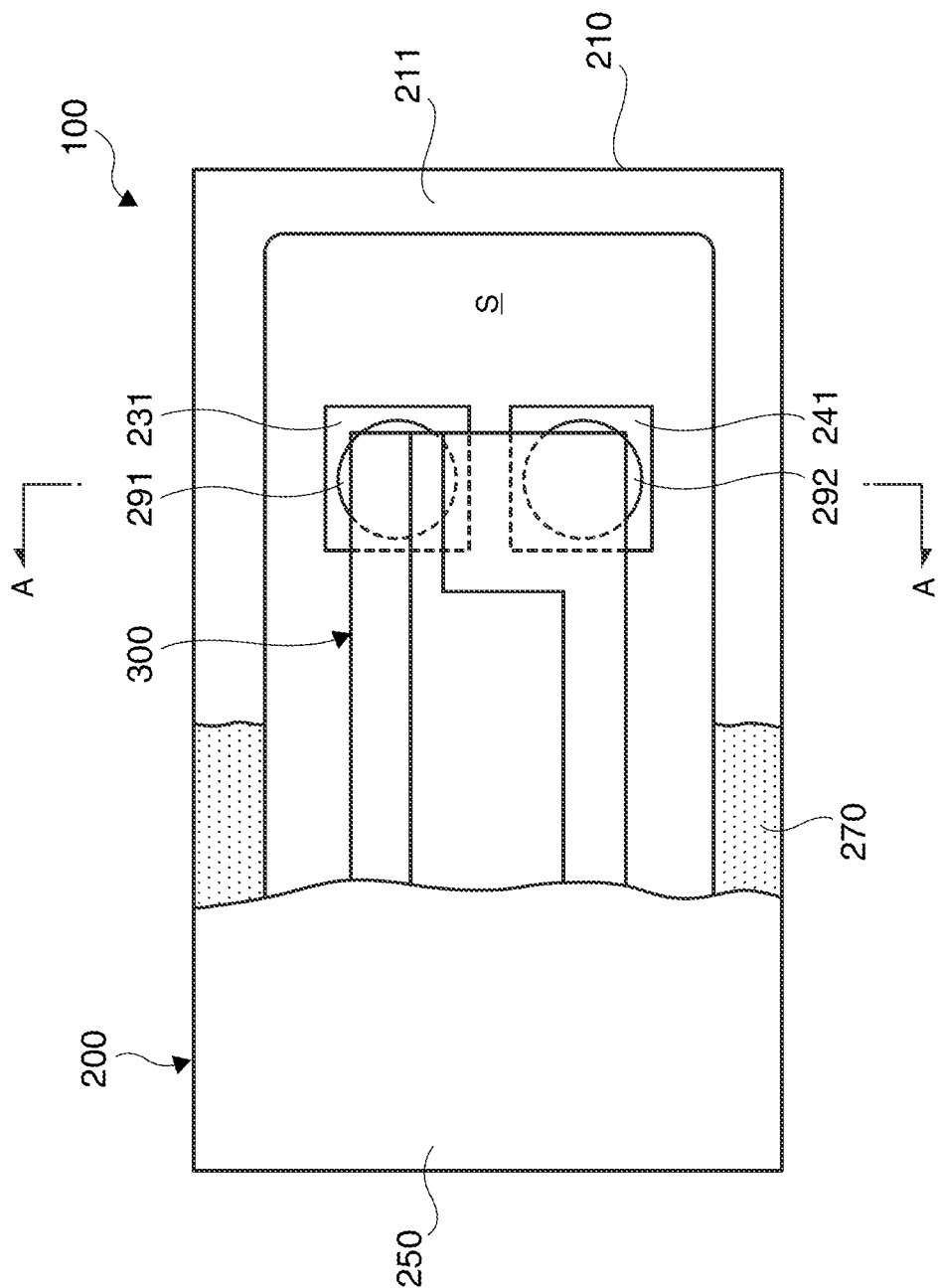
FIG. 1 is a plan view of an electronic device produced by a method for producing an electronic device according to a first embodiment of the invention.
Figure 2:
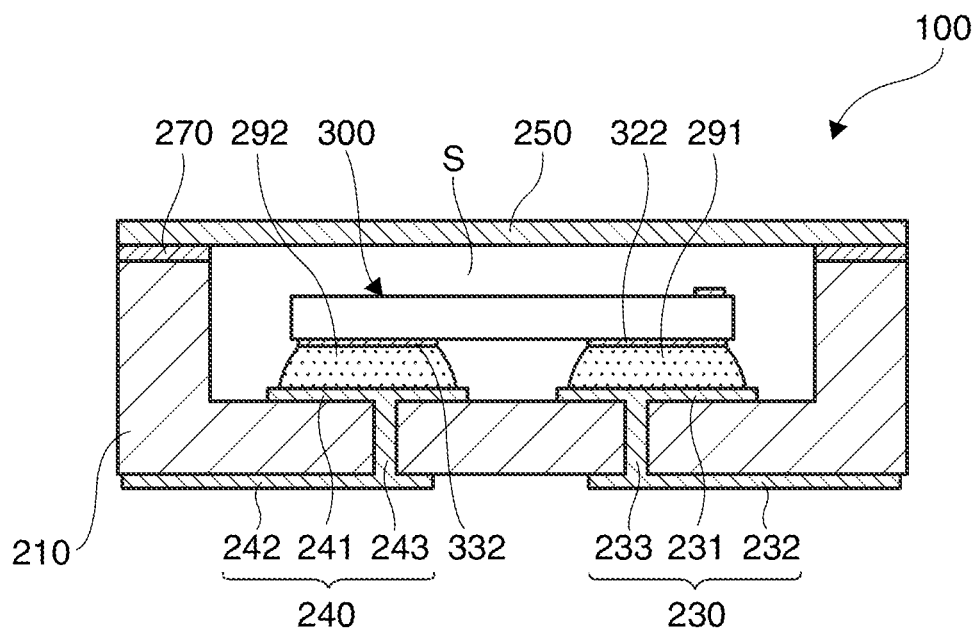
FIG. 2 is a cross-sectional view (a cross-sectional view taken along the line A-A of FIG. 1) of the electronic device shown in FIG. 1.
Figure 3A:
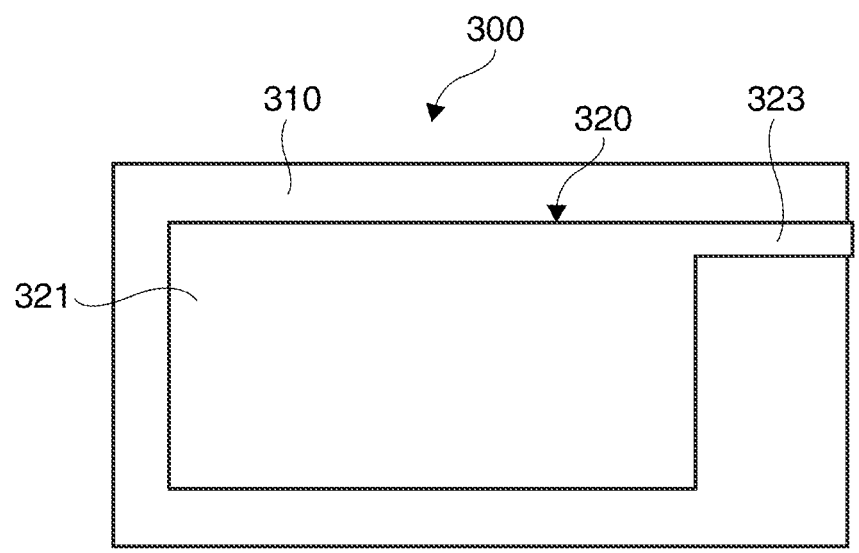
FIGS. 3A and 3B are plan views of an oscillating device of the electronic device shown in FIG. 1.
Figure 3B:
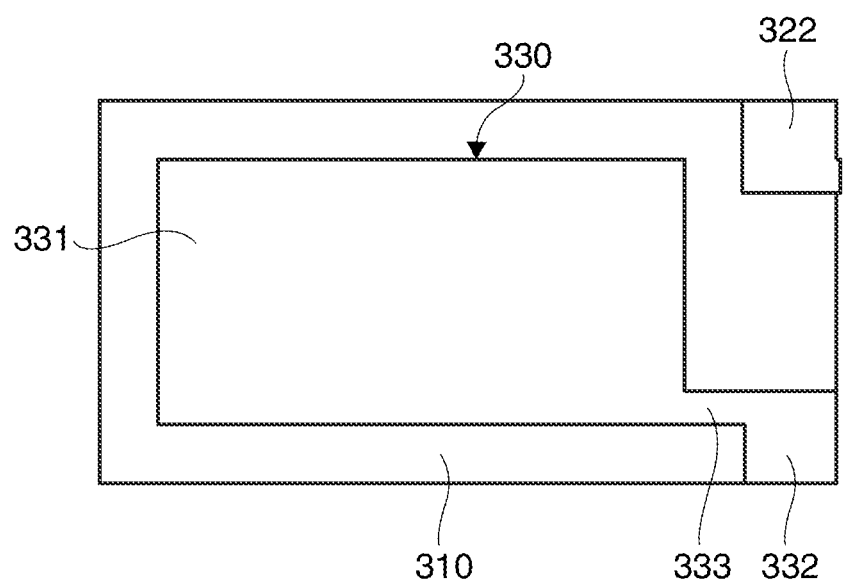
Figure 4A:
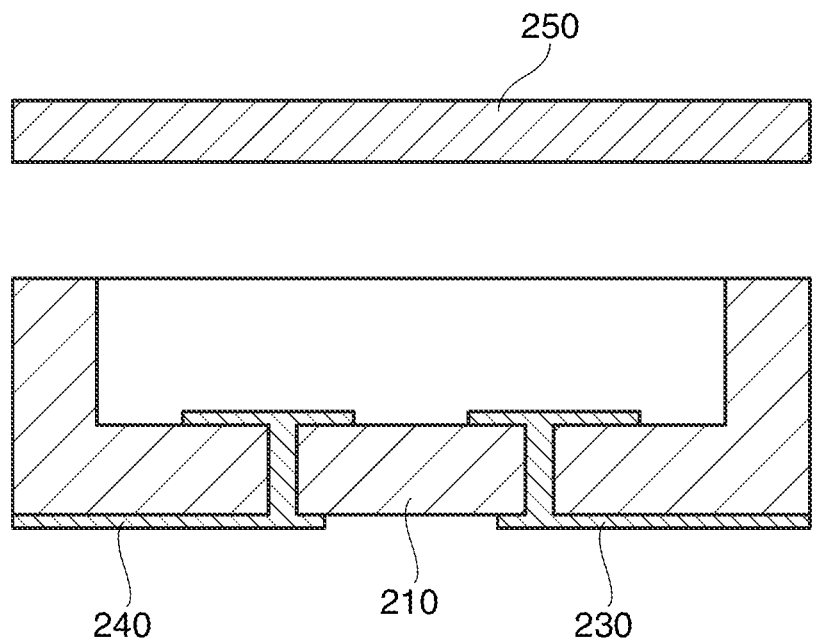
FIGS. 4A and 4B are cross-sectional views showing the method for producing the electronic device according to the first embodiment of the invention.
Figure 4B:
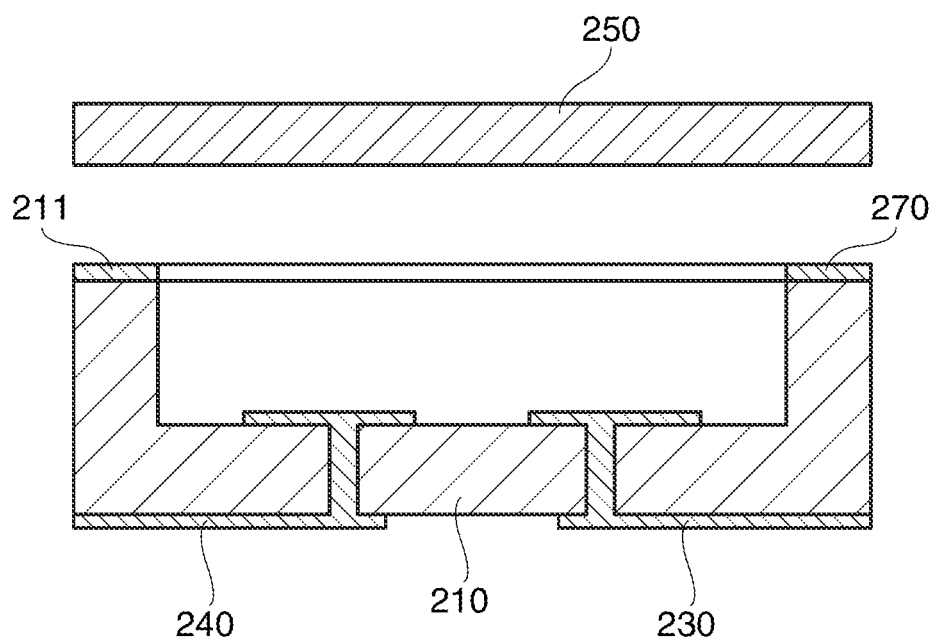
Figure 5A:
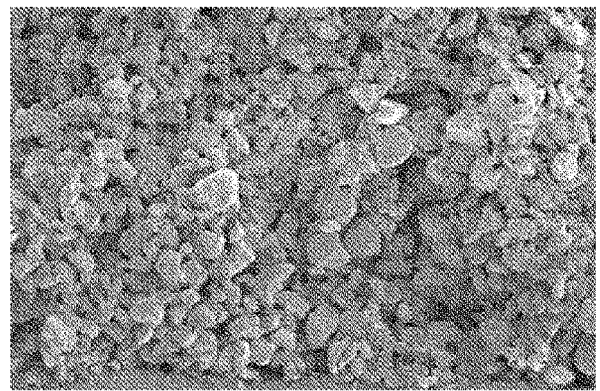
FIGS. 5A to 5C are cross-sectional images of a low-melting glass after prefiring.
Figure 5B:
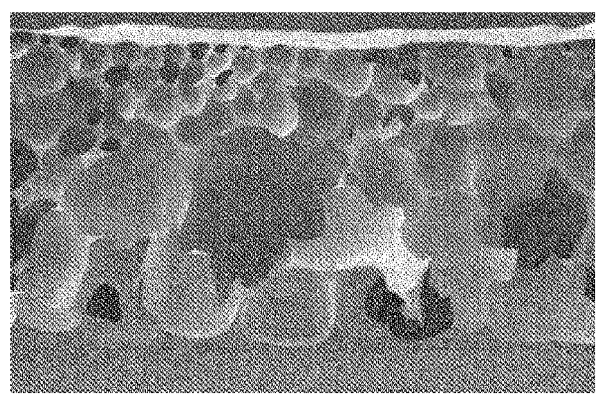
Figure 5C:
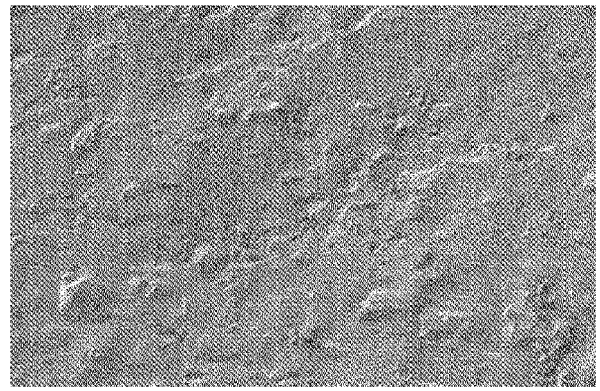
Figure 6A:
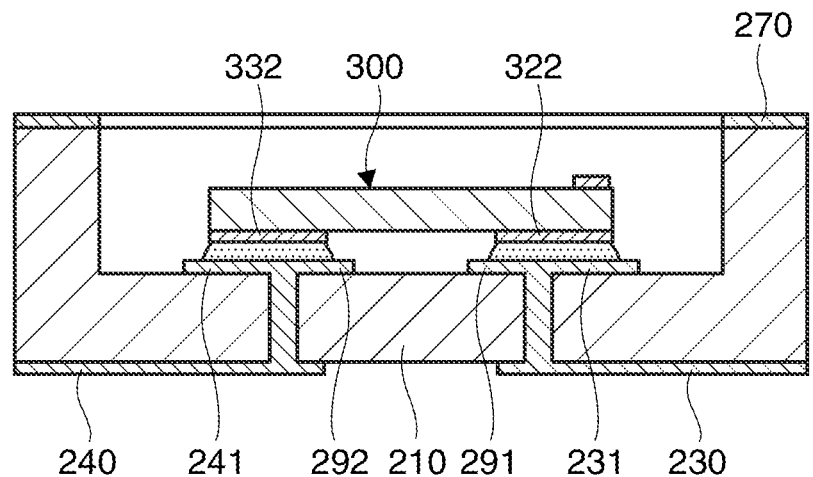
FIGS. 6A and 6B are cross-sectional views showing the method for producing the electronic device according to the first embodiment of the invention.
Figure 6B:
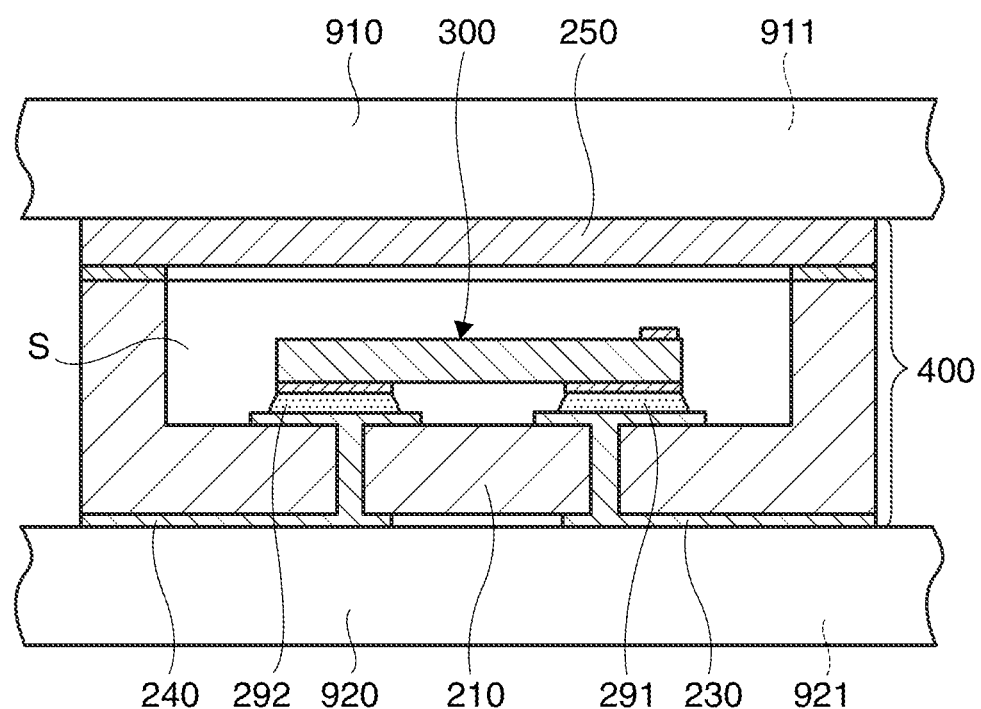

FIG. 1 is a plan view of an electronic device produced by a method for producing an electronic device according to a first embodiment of the invention. FIG. 2 is a cross-sectional view (a cross-sectional view taken along the line A-A of FIG. 1) of the electronic device shown in FIG. 1. FIGS. 3A and 3B are plan views of an oscillating device of the electronic device shown in FIG. 1. FIGS. 4A and 4B are cross-sectional views showing the method for producing the electronic device according to the first embodiment of the invention. FIGS. 5A to 5C are cross-sectional images of a low-melting glass after prefiring. FIGS. 6A and 6B are cross-sectional views showing the method for producing the electronic device according to the first embodiment of the invention. It is noted that, hereinafter, a description will be made with the upper side and the lower side in FIG. 2 being referred to as "upper" and "lower", respectively, for convenience of description.

1. Electronic Device

First, an electronic device according to the embodiment of the invention (an electronic device produced by a method for producing an electronic device according to the embodiment of the invention) will be described.

As shown in FIGS. 1 and 2, an electronic device 100 includes a package 200 and an oscillating device (functional device) 300 housed in the package 200.

Oscillating Device

FIG. 3A is a plan view from above of the oscillating device 300, and FIG. 3B is a perspective view (plan view) from above of the oscillating device 300.

As shown in FIGS. 3A and 3B, the oscillating device 300 includes a piezoelectric substrate 310 whose plan view shape is a rectangular plate, and a pair of excitation electrodes 320 and 330 formed on a surface of the piezoelectric substrate 310.

The piezoelectric substrate 310 is a quartz crystal plate which mainly vibrates in a thickness shear vibration mode. In this embodiment, as the piezoelectric substrate 310, a quartz crystal plate which is cut at a cut angle called AT cut is used. The "AT cut" refers to cutting of a quartz crystal in such a manner that the quartz crystal has a principal plane (a principal plane including an X axis and a Z' axis) obtained by rotating a plane (Y plane) including the X axis and a Z axis as crystal axes of quartz crystal about the X axis at an angle of approximately 35°15' from the Z axis in a counterclockwise direction. In the piezoelectric substrate 310 having such a structure, its longitudinal direction coincides with the X axis which is a crystal axis of quartz crystal.

The excitation electrode 320 includes an electrode section 321 formed on the upper surface of the piezoelectric substrate 310, a bonding pad 322 formed on the lower surface of the piezoelectric substrate 310, and a wiring 323 electrically connecting the electrode section 321 to the bonding pad 322. On the other hand, the excitation electrode 330 includes an electrode section 331 formed on the lower surface of the piezoelectric substrate 310, a bonding pad 332 formed on the lower surface of the piezoelectric substrate 310, and a wiring 333 electrically connecting the electrode section 331 to the bonding pad 332. The electrode sections 321 and 331 are provided facing each other through the piezoelectric substrate 310, and the bonding pads 322 and 332 are formed spaced apart from each other in an end portion on the right side of FIGS. 3A and 3B of the lower surface of the piezoelectric substrate 310.

Such excitation electrodes 320 and 330 can be formed, for example, as follows. After an underlayer of Ni or Cr is formed on the piezoelectric substrate 310 by vapor deposition or sputtering, an electrode layer of Au is formed on the underlayer by vapor deposition or sputtering, followed by patterning into a desired shape using photolithography and any of a variety of etching techniques. By forming the underlayer, the adhesiveness between the piezoelectric substrate 310 and the electrode layer is improved, and therefore, an oscillating device 300 having high reliability can be obtained.

Such an oscillating device 300 is fixed to the package 200 through a pair of supporting members 291 and 292. As the supporting member, for example, a conductive adhesive such as a silver paste is used.

Package

As shown in FIGS. 1 and 2, the package 200 includes a cavity-shaped base substrate 210 having a recess which is open toward the upper side, a plate-shaped lid 250, and a low-melting glass 270 which is interposed between the base substrate 210 and the lid 250 and joins these members to each other. In such a package 200, with the low-melting glass 270, its internal space (a storage space S) is hermetically sealed. The low-melting glass as used herein is a glass having a glass transition temperature of 600° C. or lower.

The constituent materials of the base substrate 210 and the lid 250 are not particularly limited, however, any of a variety of ceramics such as oxide-based ceramics, nitride-based ceramics, and carbide-based ceramics, or the like can be used.

The base substrate 210 is provided with a pair of electrodes 230 and 240. The electrode 230 includes a connection electrode 231 which is provided on the upper surface of the base substrate 210, an externally mounted electrode 232 which is provided on the lower surface of the base substrate 210, and a through-hole electrode 233 which is provided penetrating the base substrate 210 and connects the connection electrode 231 to the externally mounted electrode 232. Similarly, the electrode 240 includes a connection electrode 241 which is provided on the upper surface of the base substrate 210, an externally mounted electrode 242 which is provided on the lower surface of the base substrate 210, and a through-hole electrode 243 which is provided penetrating the base substrate 210 and connects the connection electrode 241 to the externally mounted electrode 242.

Such electrodes 230 and 240 can be formed, for example, as follows. After an underlayer of Ni or Cr is formed on the base substrate 210 by vapor deposition or sputtering, an electrode layer of Au is formed on the underlayer by vapor deposition or sputtering, followed by patterning into a desired shape using photolithography and an etching technique.

The oscillating device 300 stored in the storage space S is cantilevered by the base substrate 210 through a pair of silver pastes 291 and 292. The silver paste 291 is provided in contact with the connection electrode 231 and the bonding pad 322. According to this, the connection electrode 231 and the bonding pad 322 are electrically connected to each other through the silver paste 291. The other silver paste 292 is provided in contact with the connection electrode 241 and the bonding pad 332. According to this, the connection electrode 241 and the bonding pad 332 are electrically connected to each other through the silver paste 292.

2. Method for Producing Electronic Device

Next, a method for producing the electronic device 100 (a method for producing an electronic device according to the embodiment of the invention and a method for producing a package according to the embodiment of the invention) will be described with reference to FIGS. 4A to 6B.

Incidentally, hereinafter, a point (temperature) at which the viscosity of a glass reaches $4 \times 10^{14}$ P (log $\eta$=14.6) is referred to as a "strain point Ts", a point (temperature) at which the viscosity of a glass reaches $2 \times 10^{13}$ P (log $\eta$=13.3) is referred to as a "transition point Tg", a point (temperature) at which the viscosity of a glass reaches $10^{13}$ P (log $\eta$=13.0) is referred to as an "annealing point Ta", a point (temperature) at which the viscosity of a glass reaches $4.5 \times 10^{7}$ P (log $\eta$=7.65) is referred to as a "softening point Tsoft", a point (temperature) at which the viscosity of a glass reaches $10^{5}$ P (log $\eta$=5.0) is referred to as a "pour point Tf", and a point (temperature) at which the viscosity of a glass reaches $10^{4}$ P (log $\eta$=4.0) is referred to as a "working point Tw". These respective points are widely used for representing the viscosity characteristics of a glass, and are indices which can be used regardless of the glass type.

The method for producing the electronic device 100 includes: a preparation step in which the base substrate 210 and the lid 250, at least one of which is provided with the low-melting glass 270 are prepared; a prefiring step in which the low-melting glass 270 is prefired; amounting step in which the oscillating device 300 is mounted on the base substrate 210; and a joining step in which the base substrate 210 and the lid 250 are joined to each other. Hereinafter, these respective steps will be sequentially described.

Preparation Step

First, as shown in FIG. 4A, the base substrate 210 and the lid 250 are prepared. The base substrate 210 is obtained by, for example, forming conductive films serving as the electrodes 230 and 240, respectively, by a photolithographic technique and an etching technique on a green body formed into a predetermined outer shape by laminating a plurality of ceramic green sheets, followed by sintering the resulting body. Similarly, the lid 250 is obtained by sintering a green body formed into a predetermined outer shape by a single layer of a ceramic green sheet or by laminating a plurality of ceramic green sheets.

Subsequently, as shown in FIG. 4B, the low-melting glass 270 is uniformly applied to the top surface 211 of the side wall of the base substrate 210. The method for applying the low-melting glass is not particularly limited, however, for example, a method in which a material in a liquid state obtained by adding an organic solvent to a mixture of a glass component and a binder so as to decrease the viscosity is applied by screen printing can be used. The low-melting glass 270 may be applied to the lid 250 in place of the base substrate 210. In this case, the low-melting glass may be applied along a peripheral portion (a portion facing the top surface 211) of the lower surface of the lid 250 in the form of a frame. Further, the low-melting glass 270 may be applied to both of the base substrate 210 and the lid 250.

The low-melting glass 270 is not particularly limited, and for example, a vanadium-based (V—P—O) low-melting glass, a bismuth-based (Bi—B—O) low-melting glass, a lead-based (Pb—B—O) low-melting glass, or the like can be used. Among these, a glass having a linear expansion coefficient closer to that of the base substrate 210 and the lid 250 is preferred as the low-melting glass 270, and from this viewpoint, a vanadium-based low-melting glass can be preferably used. In the following description, for convenience of description, a case in which a vanadium-based low-melting glass is used will be described as a representative.

Further, the low-melting glass 270 may contain a gap material. By incorporating the gap material, the minor adjustment of the linear expansion coefficient of the low-melting glass 270 can be performed. Further, by the gap material, a space for the low-melting glass 270 can be ensured between the base substrate 210 and the lid 250, and therefore, the low-melting glass 270 can be reliably interposed between the base substrate 210 and the lid 250, as a result, these members can be reliably joined to each other. In addition, it is also possible to easily control the height of the package 200 by the gap material. The shape of the gap material is not particularly limited, and for example, it can be formed into a spherical shape, an oval shape, a flat shape, an irregular shape, a block shape, or the like.

As the gap material, a material having a melting point (transition point Tg) higher than the temperature of main firing described later, in other words, a material which is not melted at the temperature of main firing is used. The constituent material of such a gap material is not particularly limited, and examples thereof include metal materials such as Al, Au, Cr, Nb, Ta, and Ti; glass materials such as quartz glass, silicate glass (quartz glass), alkali silicate glass, soda-lime glass, potash lime glass, lead (alkali) glass, barium glass, and borosilicate glass; ceramic materials such as alumina, zirconia, ferrite, silicon nitride, aluminum nitride, boron nitride, titanium nitride, silicon carbide, boron carbide, titanium carbide, and tungsten carbide; and carbon materials such as graphite, and these materials can be used alone or in combination of two or more types. In particular, as the gap material, a high-melting glass (silica bead) is preferred. The high-melting glass is compatible with the low-melting glass 270, and also has high strength, and therefore it has an advantage that it can exhibit its function with a small addition amount (about 1 wt % or less).

Subsequently, the low-melting glass 270 applied to the base substrate 210 is heated to remove an organic solvent from the low-melting glass 270. The heating temperature of the low-melting glass 270 at this time is not particularly limited as long as the organic solvent can be removed, but is preferably a temperature equal to or lower than the transition point Tg of the low-melting glass 270. Specifically, although it varies depending on the type of the organic solvent, the heating temperature is preferably, for example, from about 150 to 180° C. By removing the organic solvent at a temperature equal to or lower than the transition point Tg in this manner, heat damage to the low-melting glass 270 can be reduced. Due to this, crystallization of the low-melting glass 270 can be effectively suppressed.

The removal of the organic solvent as described above is preferably performed in an atmospheric pressure. Accordingly, it is not necessary to prepare a special environment such as a reduced pressure atmosphere, and therefore, the removal of the organic solvent can be performed simply at low cost.

Subsequently, the low-melting glass 270 applied to the base substrate 210 is heated in air (in an oxygen-containing atmosphere) to burn down the binder in the low-melting glass 270 and remove the binder therefrom. The heating temperature of the low-melting glass 270 at this time is not particularly limited as long as the binder can be burned down, but is preferably a temperature lower than the transition point Tg of the low-melting glass 270. Specifically, although it varies depending on the type of the binder, for example, in the case where the binder is a cellulose-based binder, the heating temperature is preferably from about 200 to 300° C. By burning down the binder at a temperature lower than the transition point Tg as described above, heat damage to the low-melting glass 270 can be reduced. Due to this, crystallization of the low-melting glass 270 can be effectively suppressed.

Prefiring Step

Subsequently, the low-melting glass 270 applied to the base substrate 210 is prefired by heating to a temperature equal to or higher than the pour point Tf in a reduced pressure atmosphere. By performing the prefiring, gas in the low-melting glass 270 can be removed (defoamed). Specifically, by heating the low-melting glass 270 to a temperature equal to or higher than the pour point Tf, the viscosity of the low-melting glass 270 is sufficiently decreased, and due to the reduced pressure atmosphere, an air bubble (gas) in the low-melting glass 270 is dragged to the surface. The air bubble moving to the surface disappears as such. Accordingly, by performing the prefiring in this manner, the removal of gas in the low-melting glass 270 can be reliably performed.

By performing the prefiring as described above, generation of gas from the low-melting glass 270 during the main firing described below can be prevented (suppressed). Therefore, a high degree of vacuum in the storage space S can be obtained. Further, since the air bubbles in the low-melting glass 270 have been removed, the movement of gas through air bubbles does not occur and the base substrate 210 and the lid 250 can be hermetically joined to each other. Due to this, the degree of vacuum in the storage space S can be maintained for a long time.

The prefiring of the low-melting glass 270 as described above is preferably performed by, for example, putting the base substrate 210 on a stage (heat plate) made of a metal having a built-in heater, placing the base substrate 210 in this state in a vacuum furnace, and allowing the heater to produce heat in a reduced pressure state in the vacuum furnace. According to such a method, the heat of the heater is efficiently transferred to the low-melting glass 270 through the stage and the base substrate, and therefore, even in a reduced pressure atmosphere, the low-melting glass 270 can be efficiently heated.

Here, the prefiring temperature of the low-melting glass 270 is not particularly limited as long as it is a temperature equal to or higher than the pour point Tf, but is preferably a temperature equal to or higher than the working point Tw. By heating the low-melting glass 270 to a temperature equal to or higher than the working point Tw, the viscosity of the low-melting glass 270 is further decreased. Therefore, movement of air bubbles as described above is easy to occur, and thus, the removal of gas can be more reliably performed. Incidentally, the rate of change in viscosity of the low-melting glass 270 becomes gradual around when the temperature exceeds the working point Tw. Therefore, even if the low-melting glass 270 is heated to a temperature much exceeding the working point Tw, the defoaming effect is not so improved, but heat damage to the low-melting glass 270 is increased instead. Accordingly, from the viewpoint of achieving both the enhancement of working efficiency and the decrease in heat damage to the low-melting glass 270, it is more preferred to heat the low-melting glass 270 to a temperature in a range between the working point Tw and the working point Tw+ about 100° C.

As the reduced pressure atmosphere, an environment in which the degree of vacuum is higher is preferred. Specifically, the reduced pressure is preferably 100 Pa or less, more preferably 10 Pa or less. Further, it is preferred to control the reduced pressure conditions. Specifically, if air bubbles are generated at once under high vacuum, the bubbles may be significantly scattered therearound, and therefore, at the working point Tw or higher, it is preferred to gradually increase the degree of vacuum. If the prefiring is performed in such a reduced pressure atmosphere, the removal of air bubbles from the low-melting glass 270 as described above can be more effectively performed. Further, since the heating time can be reduced, heat damage to the low-melting glass 270 can be further reduced.

The heating time varies depending on the heating temperature or the like, however, for example, when the heating temperature is in a range between the working point Tw and the working point Tw+ about 30° C., the heating time is preferably about 10 to 60 minutes. If the heating time is in such a range, air bubbles in the low-melting glass 270 can be sufficiently removed and also the low-melting glass 270 is prevented from being excessively damaged by heat.

FIGS. 5A to 5C are cross-sectional images (SEM images) of the low-melting glass 270 after prefiring. Incidentally, the pour point Tf of this sample is 390° C., and the working point Tw is 420° C. FIG. 5A is an image when prefiring was performed under the conditions of 330° C. (lower than the pour point Tf) for 10 minutes in a reduced pressure atmosphere of 75 Pa; FIG. 5B is an image when prefiring was performed under the conditions of 450° C. (equal to or higher than the working point Tw) for 10 minutes in a reduced pressure atmosphere of 75 Pa; and FIG. 5C is an image when prefiring was performed under the conditions of 490° C. (equal to or higher than the working point Tw) for 60 minutes in a reduced pressure atmosphere of 75 Pa. From FIGS. 5A to 5C, it is found that in the case of the sample prefired at a temperature equal to or higher than the pour point Tf, defoaming was effectively performed, and it is also found that as the temperature is higher or the heating time is longer, defoaming is more effectively performed. In particular, in the case of the sample shown in FIG. 5C, the sample was in such a dense state that air bubbles were almost completely evacuated.

Mounting Step

Subsequently, as shown in FIG. 6A, the oscillating device 300 is mounted on the base substrate 210 through a pair of silver pastes 291 and 292.

Subsequently, the silver pastes 291 and 292 are dried to remove an unnecessary organic solvent and the like contained in the silver pastes 291 and 292. The drying is preferably performed specifically, for example, under the conditions of about 200 to 250° C. for about 60 to 100 minutes in a $N_2$ atmosphere. Further, as for the drying temperature, the drying is preferably performed at a temperature equal to or lower than the transition point Tg of the low-melting glass 270. If the drying temperature is in such a range, the heating temperature is relatively decreased to a low level, and therefore, heat damage to the low-melting glass 270 can be reduced.

Subsequently, the silver pastes 291 and 292 are fired by heating in a reduced pressure atmosphere. By performing the firing, an organic solvent and a reaction byproduct contained in the silver pastes 291 and 292 are burned down, and at the same time, the silver pastes 291 and 292 are hardened. By hardening the silver pastes 291 and 292, the oscillating device 300 is fixed and supported by the base substrate 210, and at the same time, the bonding pads 322 and 332 are electrically connected to the connection electrodes 231 and 241 through the silver pastes 291 and 292, respectively.

The firing temperature of the silver pastes 291 and 292 varies depending on the type thereof such as a silicone-based, an epoxy-based, or a polyimide-based, but is preferably, for example, from about 150 to 300° C. In other words, as the silver pastes 291 and 292, a silver paste having a firing temperature of about 150 to 300° C. is preferably used. Further, the firing temperature is preferably equal to or lower than the transition point Tg of the low-melting glass 270. If the firing temperature is in such a range, heat damage to the low-melting glass 270 when firing the silver pastes 291 and 292 can be reduced.

The heating time varies depending on the heating temperature or the like, however, for example, when the firing temperature is in a range of about 250 to 300° C. as described above, the heating time is preferably about 5 to 6 hours. If the heating time is in such a range, the silver pastes 291 and 292 can be reliably fired, and also the low-melting glass 270 is prevented from being excessively damaged by heat.

As the reduced pressure atmosphere, an environment in which the degree of vacuum is higher is preferred. Specifically, the reduced pressure is preferably 100 Pa or less, more preferably 1 Pa or less. If the firing is performed in such a reduced pressure atmosphere, the removal of an organic solvent and a reaction byproduct in the inside of the silver paste is further accelerated and such an organic solvent and a reaction byproduct can be efficiently removed.

Joining Step

Subsequently, as shown in FIG. 6B, the base substrate 210 and the lid 250 are superimposed on each other such that the low-melting glass 270 is interposed therebetween, whereby a laminate 400 is obtained. Such a laminate 400 is sandwiched by a jig provided with a pair of pressing plates 910 and 920, and by controlling the distance between the pair of pressing plates 910 and 920, a given pressure can be applied to the laminate 400 as needed.

The pair of pressing plates 910 and 920 are composed of, for example, a material having excellent heat conductivity such as a metal, and moreover have built-in heaters 911 and 921, respectively. The heaters 911 and 921 are each a heating unit for heating the laminate 400 (the low-melting glass 270). That is, the pressing plates 910 and 920 are each a heat plate.

By providing such pressing plates 910 and 920, heat generated from the heaters 911 and 921 is efficiently transferred to the laminate 400 through the pressing plates 910 and 920, and therefore, the laminate 400 can be efficiently heated. Further, by providing such pressing plates 910 and 920, even in a reduced pressure atmosphere in which it is difficult to transfer heat, heat can be efficiently transferred to the laminate 400, and therefore, joining described later can be efficiently and reliably performed.

Subsequently, the laminate 400 is placed in a reduced pressure atmosphere in a state where almost no pressure is applied to the laminate 400 by the pair of pressing plates 910 and 920. Since the surface of the low-melting glass 270 has minute irregularities, a gap (not shown) is formed between the low-melting glass 270 and the lid 250. Due to this, if the laminate 400 is placed in a reduced pressure atmosphere, gas in the internal space (storage space S) of the laminate 400 is sucked out of the laminate 400 through the gap to bring the internal space into a reduced pressure state. As the reduced pressure atmosphere, an environment in which the degree of vacuum is higher is preferred. Specifically, the environment is required to have a degree of vacuum capable of satisfying the device characteristics, and the reduced pressure is preferably 10 Pa or less, more preferably 1 Pa or less. If the laminate 400 is placed in such a reduced pressure atmosphere, the degree of vacuum in the internal space (storage space S) of the laminate 400 can be sufficiently increased.

Subsequently, in a state where the reduced pressure atmosphere is maintained, the heaters 921 and 922 are driven to heat the low-melting glass 270 to a temperature equal to or higher than the pour point Tf, and thus main firing is performed. By performing the main firing, the viscosity of the low-melting glass 270 can be sufficiently decreased.

The heating temperature (main firing temperature) in this step is not particularly limited as long as it is a temperature equal to or higher than the pour point Tf, however, the heating temperature is preferably equal to or lower than the working point Tw. By setting the heating temperature to a temperature equal to or lower than the working point Tw, generation of gas from the silver pastes 291 and 292, the base substrate 210, and the lid 250 can be effectively suppressed. Further, since heat damage to the low-melting glass 270 can be reduced, crystallization of the low-melting glass 270 can be suppressed.

After the low-melting glass 270 is heated to a temperature equal to or higher than the pour point Tf to sufficiently decrease the viscosity of the low-melting glass 270, pressure is applied to the laminate 400 from both sides by the pair of pressing plates 910 and 920. Then, this pressure applying state is maintained for a given time (preferably for about 10 to 30 minutes). By doing this, the low-melting glass 270 is crushed and the above-described gap disappears.

In this embodiment, the step of performing main firing of the low-melting glass 270 and the step of applying pressure to the laminate 400 are sequentially performed, however, these two steps may be performed simultaneously. That is, the low-melting glass 270 may be heated while applying pressure to the laminate 400. By performing these two steps simultaneously in this manner, the production process for the electronic device 100 can be reduced, and also the production time can be reduced.

Subsequently, while maintaining the application of pressure to the laminate 400, the low-melting glass 270 is cooled. By doing this, the low-melting glass 270 is hardened, and the base substrate 210 and the lid 250 are hermetically joined to each other through the low-melting glass 270. The cooling method is not particularly limited, but is preferably performed as follows. First, the low-melting glass 270 is cooled to the annealing point Ta, and by maintaining this temperature for a given time (for example, for 15 to 30 minutes), strain in the low-melting glass 270 is removed, and thereafter the low-melting glass 270 is cooled to a temperature equal to or lower than the strain point Ts. By doing this, the low-melting glass 270 having no or little strain can be formed.

As described above, the electronic device 100 in which the internal space S is hermetically sealed is produced. After the electronic device 100 is produced in this manner, the reduced pressure atmosphere is relieved, and also the application of pressure by the pressing plates 910 and 920 is relieved, and then, the electronic device 100 is taken out.

Hereinabove, the method for producing the electronic device 100 has been described in detail.

In the method for producing the electronic device 100 as described above, when performing the main firing, the low-melting glass 270 is in a state of having been defoamed by prefiring, and therefore, the formation of the above-described leakage path (a hollow communicating the inside with the outside of the storage space S) caused by an air bubble is prevented in the low-melting glass 270 and at the interfaces between the low-melting glass 270 and the base substrate 210 and between the low-melting glass 270 and the lid 250, and as a result, an electronic device 100 having high airtightness is produced.

Further, by appropriately performing the temperature control in each step, the low-melting glass 270 is prevented from being excessively damaged by heat to suppress the crystallization (alteration) of the low-melting glass 270. Therefore, the low-melting glass 270 can exhibit excellent adhesion strength, and can rigidly join the base substrate 210 and the lid 250 to each other. In particular, since generation of gas from the silver pastes 291 and 292 is suppressed by controlling the heating temperature when performing the main firing, a decrease in the degree of vacuum in the storage space S can be effectively suppressed.

Second Embodiment

Next, a second embodiment of the method for producing an electronic device according to the invention will be described.

Figure 7:
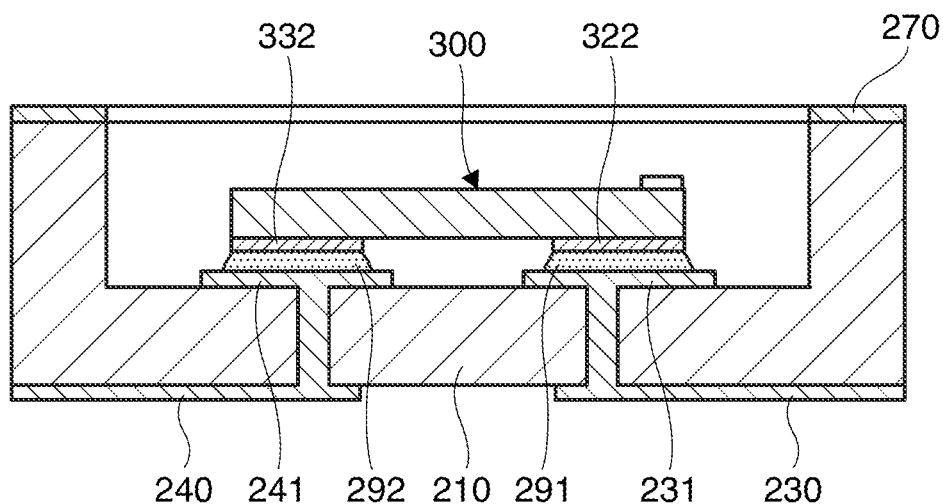
FIG. 7 is a cross-sectional view showing a method for producing an electronic device according to a second embodiment of the invention.

FIG. 7 is a cross-sectional view for illustrating the method for producing the electronic device according to the second embodiment of the invention.

Hereinafter, with respect to the method for producing an electronic device according to the second embodiment, different points from those of the embodiment described above will be mainly described and a description of the same matters will be omitted.

The electronic device of the second embodiment of the invention is the same as that of the first embodiment described above except that the firing of silver pastes and the prefiring of a low-melting glass are performed simultaneously (in the same step). Incidentally, the same components as those of the first embodiment described above are denoted by the same reference signs.

The method for producing an electronic device 100 includes: a preparation step in which a base substrate 210 and a lid 250, at least one of which is provided with a low-melting glass 270; a mounting step in which an oscillating device 300 is mounted on the base substrate 210; a prefiring step in which the firing of silver pastes 291 and 292 and the prefiring of the low-melting glass 270 are performed; and a joining step in which the base substrate 210 and the lid 250 are joined to each other. Hereinafter, these respective steps will be sequentially described.

Preparation Step

This step is the same as that of the first embodiment described above, and therefore, a description thereof will be omitted.

Mounting Step

First, as shown in FIG. 7, the oscillating device 300 is mounted on the base substrate 210 through a pair of silver pastes 291 and 292.

Subsequently, the silver pastes 291 and 292 are dried to remove an unnecessary organic solvent and the like contained in the silver pastes 291 and 292. The drying is preferably performed specifically, for example, under the conditions of about 200 to 250° C. for about 60 to 100 minutes in a $N_2$ atmosphere. Further, as for the drying temperature, the drying is preferably performed at a temperature equal to or lower than the transition point Tg of the low-melting glass 270. If the drying temperature is in such a range, the heating temperature is relatively decreased to a low level, and therefore, heat damage to the low-melting glass 270 can be reduced.

Prefiring Step

First, the low-melting glass 270 applied to the base substrate 210 is prefired by heating to a temperature equal to or higher than the pour point Tf in a reduced pressure atmosphere. By performing the prefiring of the low-melting glass 270, gas in the low-melting glass 270 can be removed (defoamed). Further, by utilizing the heat during the prefiring of the low-melting glass 270, the silver pastes 291 and 292 are fired. That is, the firing of the silver pastes 291 and 292 is performed simultaneously with the prefiring of the low-melting glass 270. By firing the silver pastes 291 and 292, an organic solvent and a reaction byproduct in the silver pastes 291 and 292 are more efficiently sintered and removed, and the silver pastes 291 and 292 are hardened. Incidentally, the conditions for this step can be set to the same conditions as those for the prefiring step of the first embodiment described above. As compared with the prefiring of the low-melting glass 270, the conditions for the firing of the silver pastes 291 and 292 are loose, and therefore, by adopting the conditions for the prefiring of the low-melting glass 270, the prefiring of the low-melting glass 270 and the firing of the silver pastes 291 and 292 can be reliably performed, and an effect of suppressing discharge of gas can be exhibited.

In this manner, by simultaneously performing the prefiring of the low-melting glass 270 and the firing of the silver pastes 291 and 292 (in the same step), for example, as compared with the first embodiment described above, the heat history (the record of number of times that heat is applied) of the low-melting glass 270 can be reduced, and therefore, heat damage to the low-melting glass 270 can be more effectively reduced. Further, by more strongly removing discharge gas from the silver pastes 291 and 292, which may be generated during sealing, the degree of vacuum in the internal space S can be further maintained.

Joining Step

This step is the same as that of the first embodiment described above, and therefore, a description thereof will be omitted.

According also to the second embodiment, the same effect as that of the first embodiment described above can be exhibited.

Electronic Apparatus

Next, an electronic apparatus including the electronic device according to the embodiment of the invention will be described in detail with reference to FIGS. 8 to 11.

Figure 8:
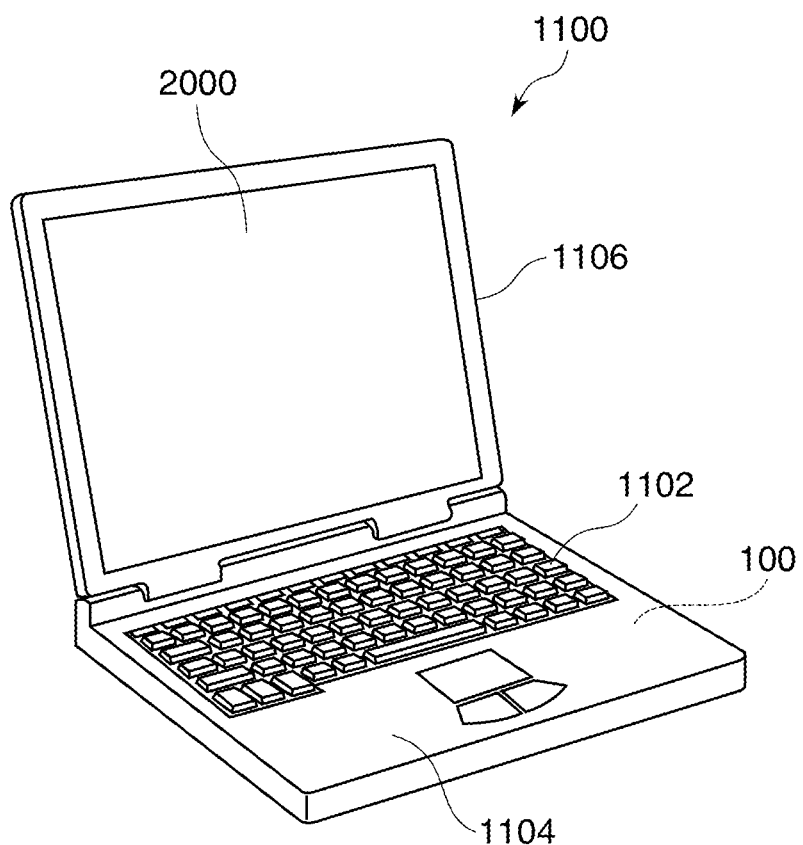
FIG. 8 is a perspective view showing a structure of a personal computer of a mobile type (or a notebook type), to which an electronic apparatus including the electronic device according to the embodiment of the invention is applied.

FIG. 8 is a perspective view showing a structure of a personal computer of a mobile type (or a notebook type), to which an electronic apparatus including the electronic device according to the embodiment of the invention is applied. In this drawing, a personal computer 1100 includes a main body 1104 provided with a key board 1102, and a display unit 1106 provided with a display section 2000. The display unit 1106 is supported rotatably with respect to the main body 1104 via a hinge structure. In such a personal computer 1100, an electronic device 100 which functions as a filter, an oscillator, a reference clock, or the like is incorporated.

Figure 9:
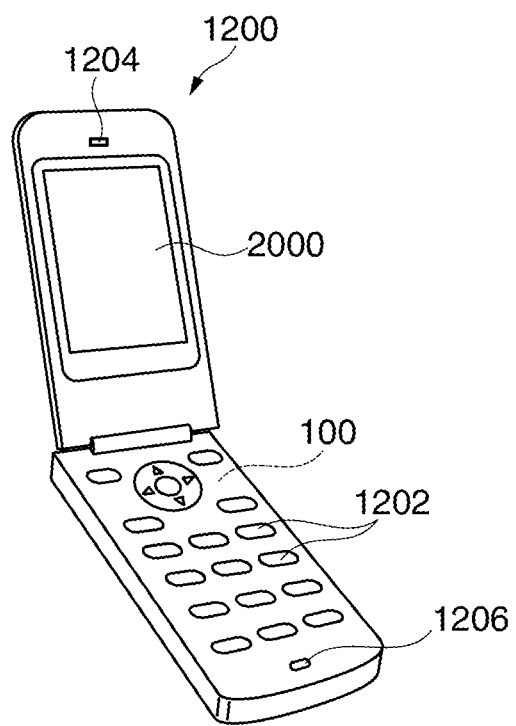
FIG. 9 is a perspective view showing a structure of a cellular phone (also including a PHS), to which an electronic apparatus including the electronic device according to the embodiment of the invention is applied.

FIG. 9 is a perspective view showing a structure of a cellular phone (also including a PHS), to which an electronic apparatus including the electronic device according to the embodiment of the invention is applied. In this drawing, a cellular phone 1200 includes a plurality of operation buttons 1202, an earpiece 1204, and a mouthpiece 1206, and between the operation buttons 1202 and the earpiece 1204, a display section 2000 is placed. In such a cellular phone 1200, an electronic device 100 which functions as a filter, an oscillator, or the like is incorporated.

Figure 10:
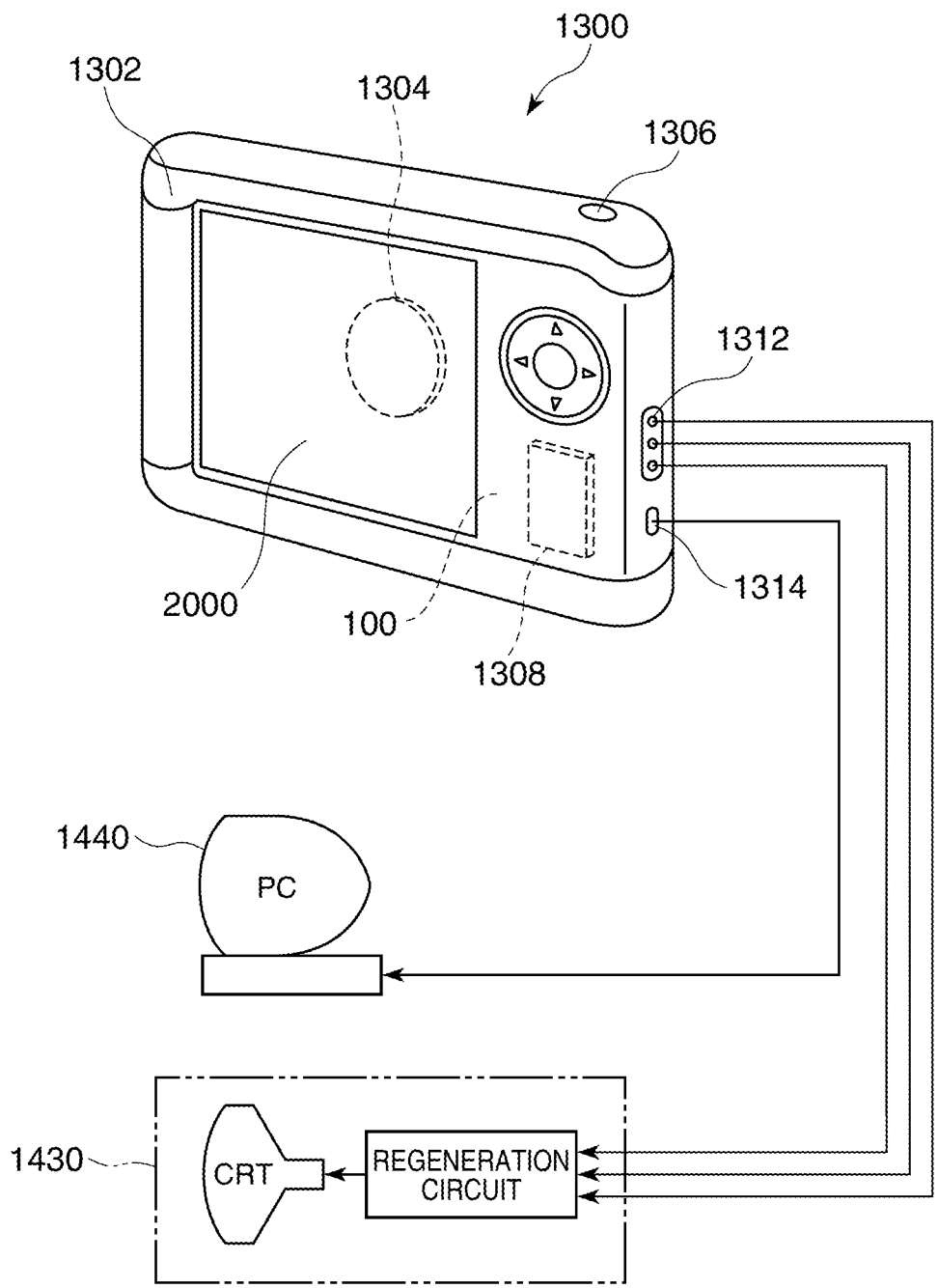
FIG. 10 is a perspective view showing a structure of a digital still camera, to which an electronic apparatus including the electronic device according to the embodiment of the invention is applied.

FIG. 10 is a perspective view showing a structure of a digital still camera, to which an electronic apparatus including the electronic device according to the embodiment of the invention is applied. In this drawing, connection to external apparatuses is also briefly shown. A usual camera exposes a silver salt photographic film to light on the basis of an optical image of a subject. On the other hand, a digital still camera 1300 generates an imaging signal (image signal) by photoelectrically converting an optical image of a subject into the imaging signal with an imaging device such as a CCD (Charge Coupled Device).

On a back surface of a case (body) 1302 in the digital still camera 1300, a display section is provided, and the display section is configured to perform display on the basis of the imaging signal of the CCD. The display section functions as a finder which displays a subject as an electronic image. Further, on a front surface side (on a back surface side in the drawing) of the case 1302, a light receiving unit 1304 including an optical lens (imaging optical system), a CCD, etc. is provided.

When a person who takes a picture confirms an image of a subject displayed on the display section and pushes a shutter button 1306, an imaging signal of the CCD at that time is transferred to a memory 1308 and stored there. Further, a video signal output terminal 1312 and an input/output terminal 1314 for data communication are provided on a side surface of the case 1302 in the digital still camera 1300. As shown in the drawing, a television monitor 1430 and a personal computer 1440 are connected to the video signal output terminal 1312 and the input/output terminal 1314 for data communication, respectively, as needed. Moreover, the digital still camera 1300 is configured such that the imaging signal stored in the memory 1308 is output to the television monitor 1430 or the personal computer 1440 by means of a predetermined operation. In such a digital still camera 1300, an electronic device 100 which functions as a filter, an oscillator, or the like is incorporated.

Figure 11:
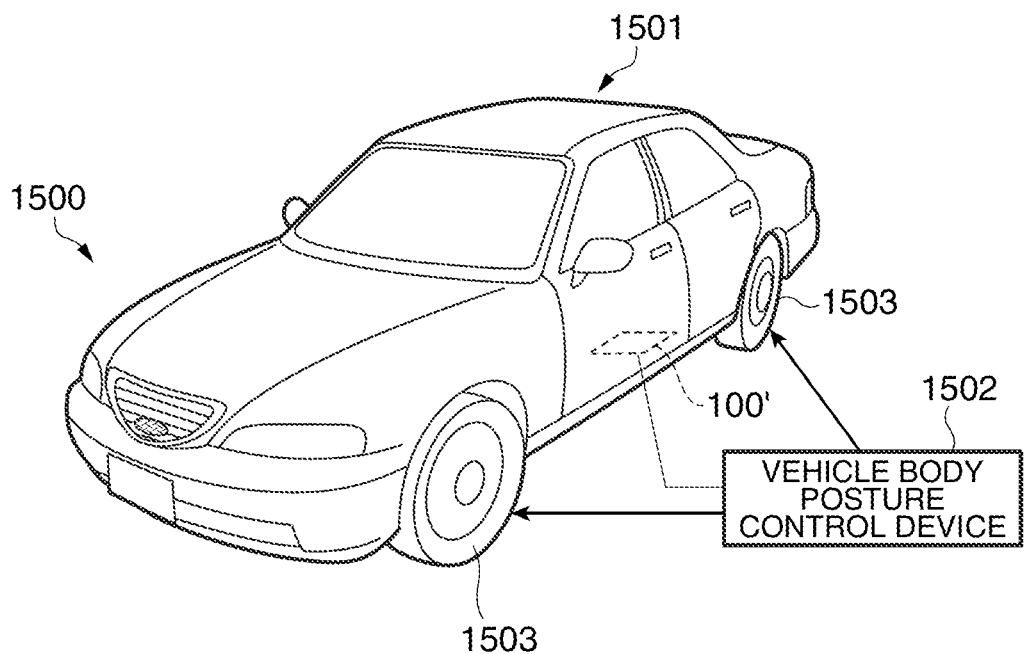
FIG. 11 is a perspective view showing a structure of a mobile body (automobile), to which an electronic apparatus including the electronic device according to the embodiment of the invention is applied.

FIG. 11 is a perspective view showing a structure of a mobile body (automobile), to which an electronic apparatus including the electronic device according to the embodiment of the invention is applied. In an automobile 1500, for example, the electronic device according to the embodiment of the invention is incorporated as a gyro sensor. In this case, an electronic device 100' using, as a functional device, an angular velocity detecting device (gyro device) in place of the oscillating device 300 can be used. By using such an electronic device 100', the posture of a vehicle body 1501 can be detected. A detection signal from the electronic device 100' is supplied to a vehicle body posture control device 1502. The vehicle body posture control device 1502 detects the posture of the vehicle body 1501 on the basis of the detection signal and controls the stiffness of a suspension on the basis of the detection result, or can control a brake for an individual wheel 1503. Other than these, such posture control can be utilized in robots walking with two legs and radio control helicopters. As described above, in order to realize the posture control of a variety of mobile bodies, the electronic device 100' is incorporated.

Incidentally, the electronic apparatus including the electronic device according to the embodiment of the invention can be applied to, other than the personal computer (mobile personal computer) shown in FIG. 8, the cellular phone shown in FIG. 9, the digital still camera shown in FIG. 10, and the mobile body shown in FIG. 11, for example, inkjet type ejection apparatuses (e.g., inkjet printers), laptop personal computers, televisions, video cameras, videotape recorders, car navigation devices, pagers, electronic notebooks (including those having a communication function), electronic dictionaries, pocket calculators, electronic game devices, word processors, work stations, television telephones, television monitors for crime prevention, electronic binoculars, POS terminals, medical devices (e.g., electronic thermometers, blood pressure meters, blood sugar meters, electrocardiogram displaying devices, ultrasound diagnostic devices, and electronic endoscopes), fish finders, various measurement devices, gauges (e.g., gauges for vehicles, airplanes, and ships), flight simulators, etc.

Hereinabove, the method for producing a package, the method for producing an electronic device, and the electronic device according to the invention have been described based on the embodiments shown in the drawings, but it should be noted that the invention is not limited to the embodiments. The respective components can be replaced with components having an arbitrary structure capable of functioning in the same manner. Further, any other arbitrary structure may be added to the invention. In addition, the respective embodiments may be appropriately combined.

In the embodiments described above, a configuration in which the base substrate is in the form of a cavity, and the lid is in the form of a plate has been described, however, the forms of the base substrate and the lid are not particularly limited as long as when these members are joined to each other to form a package, a space for storing the oscillating device can be formed therein. For example, contrary to the embodiments described above, a configuration in which the base substrate is in the form of a plate and the lid is in the form of a cavity may be adopted. Further, the both members may be in the form of a cavity.

The entire disclosure of Japanese Patent Application No. 2012-181247, filed Aug. 18, 2012 is expressly incorporated by reference herein.

What is claimed is:

1. An electronic device comprising:
    a base substrate;
    a lid joined to the base substrate and defining an internal space therebetween; and
    a functional device disposed in the internal space,
    wherein the lid is formed from a low-melting glass from which gas is removed so that the low-melting glass is in a dense state.

2. The electronic device of claim 1 which is made comprising the steps of:
    preparing the base substrate and the lid, at least one of which is provided with the low-melting glass;
    defoaming the low-melting glass by heating the low-melting glass to a temperature equal to or higher than the pour point in a reduced pressure atmosphere so as to remove the as from the low melting glass;
    joining the base substrate and the lid to each other by superimposing the base substrate and the lid on each other through the low-melting glass, and then heating the low-melting glass to a temperature equal to or higher than the pour point in a reduced pressure atmosphere; and
    mounting the functional device on the base substrate through a supporting member, which is performed before the joining.

3. The electronic device according to claim 2, wherein in the defoaming, the low-melting glass is heated to a temperature equal to or higher than the working point.

4. The electronic device according to claim 2, wherein in the joining, the low-melting glass is heated to a temperature equal to or higher than the pour point and equal to or lower than the working point.

5. The electronic device according to claim 2, wherein the method includes heating the low-melting glass to a temperature lower than the transition point in an oxygen-containing atmosphere, which is performed before the defoaming.

6. The electronic device according to claim 2, wherein the low-melting glass is provided for at least the base substrate, and the mounting the functional device is performed before the defoaming.

7. The electronic device according to claim 6, wherein in the defoaming, the low-melting glass is defoamed, and at the same time, the supporting member is fired.

8. The electronic device of claim 1 which is made comprising the steps of:
    preparing the base substrate and the lid, at least one of which is provided with the low-melting glass;
    defoaming the low-melting glass by heating the low-melting glass to a temperature equal to or higher than the pour point in a reduced pressure atmosphere so as to remove the gas from the low-melting glass; and
    joining the base substrate and the lid to each other by superimposing the base substrate and the lid on each other through the low-melting glass, and then heating the low-melting glass to a temperature equal to or higher than the pour point in a reduced pressure atmosphere.

9. An electronic apparatus comprising the electronic device according to claim 1.

* * * * *